United States Patent [19]

Takeuchi et al.

[11] Patent Number: 5,512,515
[45] Date of Patent: Apr. 30, 1996

[54] PROCESS FOR FORMING ALUMINUM ALLOY THIN FILM

[75] Inventors: Hideki Takeuchi; Koichiro Kawamura, both of Sagamihara, Japan

[73] Assignee: Nippon Steel Corporation, Tokyo, Japan

[21] Appl. No.: 910,876

[22] Filed: Jul. 9, 1992

[30]   Foreign Application Priority Data

Jul. 10, 1991   [JP]   Japan .................................. 3-170142

[51] Int. Cl.$^6$ ............................................. H01L 21/44
[52] U.S. Cl. .......................... 437/196; 437/197; 437/198
[58] Field of Search .................................. 437/196, 197, 437/198

[56]   References Cited

U.S. PATENT DOCUMENTS

| | | | |
|---|---|---|---|
| 4,502,207 | 3/1985 | Ohshima et al. | 357/67 |
| 5,154,949 | 10/1992 | Shindo et al. | 427/253 |
| 5,208,187 | 5/1993 | Tsubouchi et al. | 437/194 |
| 5,238,874 | 8/1993 | Yamada | 437/194 |

FOREIGN PATENT DOCUMENTS 0111568   5/1991   Japan .

*Primary Examiner*—R. Bruce Breneman
*Assistant Examiner*—Ramamohan Paladugu
*Attorney, Agent, or Firm*—Cushman Darby & Cushman

[57]   ABSTRACT

A process comprising the steps of introducing an organic aluminum compound, including at least one of trialkylaluminum and dialkylhydriroaluminum, a copper chelate compound and a silane compound having one to three silicon atoms in the form of a gas mixture into a reactor holding a substrate heated to 250° to 400° C., forming an aluminum alloy thin film containing 0 to 5% copper and 0.1 to 2% silicon on the aforementioned substrate, and heat-treating the substrate formed with the aluminum thin film in an inert gas or hydrogen atmosphere at 400° to 450° C. In application of the present invention to a wiring technique of the semiconductor integrated circuit, it is possible to form a metallic thin film capable of completely smoothing a contact hole having a high aspect ratio.

12 Claims, 2 Drawing Sheets

PROCESS FOR FORMING ALUMINUM ALLOY THIN FILM

BACKGROUND OF THE INVENTION

1. Field of the Invention

The present invention relates to a process for forming an aluminum alloy thin film. Particularly the present invention relates to a process for forming an aluminum alloy thin film by utilizing a chemical vapor deposition technique (CVD method) applicable to wiring of semiconductor integrated circuits.

2. Description of the Related Art

In the field of semiconductor integrated circuits in which many circuit elements are integrated on a semiconductor substrate, demands for high integration have been increasingly made recently, and such demands require the wiring width on the integrated circuit to be refined.

Conventionally, aluminum (Al) has been used mainly for the wiring of semiconductor integrated circuits, but in accordance with the refining of the wiring width, problems such as electro-migration and stress-migration have occurred. In order to solve the problems, improvement in the quality of wiring metals has been sought. As a result, Al—Cu alloy, Al—Si alloy, Al—Si—Cu alloy etc. are now employed as wiring metals.

Meanwhile, an aluminum alloy thin film for wiring a semiconductor integrated circuit is conventionally formed by a spattering or bias-sputtering method. However, a ratio of the depth of a contact hole to the diameter of the hole has increased with a refining of the wiring width, in other words the aspect ratio (depth/diameter) has become higher. For this reason, it has become difficult to completely smooth contact holes by sputtering or a bias sputtering method. Further, there is also a fear that the wafer is damaged by impact of the electrons or ions existing in the spatter chamber.

The present invention has been achieved in order to solve the problems stated above, and it is an object of the present invention to provide a novel process for forming an aluminum alloy thin film.

It is another object of the present invention to provide a method for forming an aluminum alloy thin film, whereby a substrate is less impacted by ions etc.

It is still another object of the present invention to provide a method for forming an aluminum alloy thin film for the purpose of wiring sufficiently effective to deal with a refining of lining width entailed with the highly increased integration of semiconductor integrated circuits.

SUMMARY OF THE INVENTION

In order to achieve the above object, the present invention provides a process for forming an aluminum alloy thin film comprising the steps of: introducing an organic aluminum compound including at least one of trialkylaluminum and dialkylhydriroaluminum, a copper chelate compound and a silane compound having one to three silicon atoms in the form of a gas mixture into a reactor holding a substrate heated to 250° to 400° C.; forming an aluminum alloy thin film containing 0 to 5% copper and 0.1 to 2% silicon on the aforementioned substrate, and heat-treating the substrate formed with the aluminum thin film thereon in an inert gas or hydrogen atmosphere at 400° to 450° C.

The present invention also provides a process for forming an aluminum alloy thin film comprising the steps of: introducing an organic aluminum compound including at least one of trialkylaluminum and dialkylhydriroaluminum, a copper chelate compound and a silane compound having one to three silicon atoms in the form of a gas mixture into a rector holding a substrate heated to 250° to 400° C., forming an aluminum alloy thin film containing 0 to 5% copper and 0.1 to 2% silicon on the aforementioned substrate, and heat-treating the substrate formed with the aluminum thin film thereon in an inert gas or hydrogen atmosphere at 400° to 450° C.

The present invention further provides a process of wiring an aluminum alloy thin film for use in a semiconductor integrated circuit comprising: a first step of introducing an organic aluminum compound including at least one of trialkylaluminum and dialkylhydriroaluminum, a copper chelate compound and a silane compound having one to three silicon atoms in the form of a gas mixture into a rector holding a substrate heated to 250° to 400° C., and forming an aluminum alloy thin film containing 0 to 5% copper and 0.1 to 2% silicon on the aforementioned substrate, and a second step of heat-treating, in an inert gas or hydrogen atmosphere at 400° to 450° C., the aforementioned substrate on which the aluminum thin film has been formed in the first step.

The present invention further provides an apparatus including an aluminum source vessel holding an aluminum source for producing an aluminum gas, a copper source vessel holding a copper source for producing a copper gas, and a silicon source vessel holding a silicon source for producing a silicon gas, and reacting, in a rector, an aluminum gas supplied from the aluminum source vessel, a copper gas supplied from the copper source vessel and a silicon gas supplied from the silicon source vessel together with a substrate to form an aluminum-copper-silicon alloy film on the substrate; the apparatus further comprising a hydrogen gas generating source, dilution gas supplying lines for supplying the hydrogen gas generated from the hydrogen gas generating source to mix and dilute the aluminum gas generated from the aluminum source vessel and the copper gas generated from the copper source vessel, and gas mixture supplying lines for mixing the above diluted aluminum gas and the diluted copper gas supplied through the dilution gas supplying lines, and the silicon gas supplied from the above silicon source vessel to provide the mixture for the aforementioned reactor.

The present invention still further provides a semiconductor device comprising a silicon semiconductor substrate having circuit elements formed on the surface thereof, and having, in a predetermined position a contact hole with silicon material exposed, an aluminum alloy containing 0 to 5% copper and 0.1 to 2% silicon, and being grown in contact with the aforementioned silicon material in the contact hole of the silicon semiconductor substrate.

According to the present invention having an arrangement described above, in applying the line-patterning of the semiconductor integrated circuit, it is possible to smooth a contact hole having a high aspect ratio. Therefore, it is possible to reliably form a line-pattern, thus improving the reliability of cabling. Further according to the present invention, it is possible to form an aluminum alloy thin film directly on the silicon material, so that the preparing steps can be simplified. Moreover, in accordance with the present invention, there is no fear of damaging the wafer by impact of electrons and irons, like the sputtering method, so that it is possible not only to improve the reliability of the prepared productions, but also to realize a wiring technique that is effective enough to deal with the tendency of refining the wiring width for improved integration of the semiconductor integrated circuits.

DESCRIPTION OF THE PREFERRED EMBODIMENTS

The present invention will be described hereinafter with reference to an embodiment.

Figure 1:
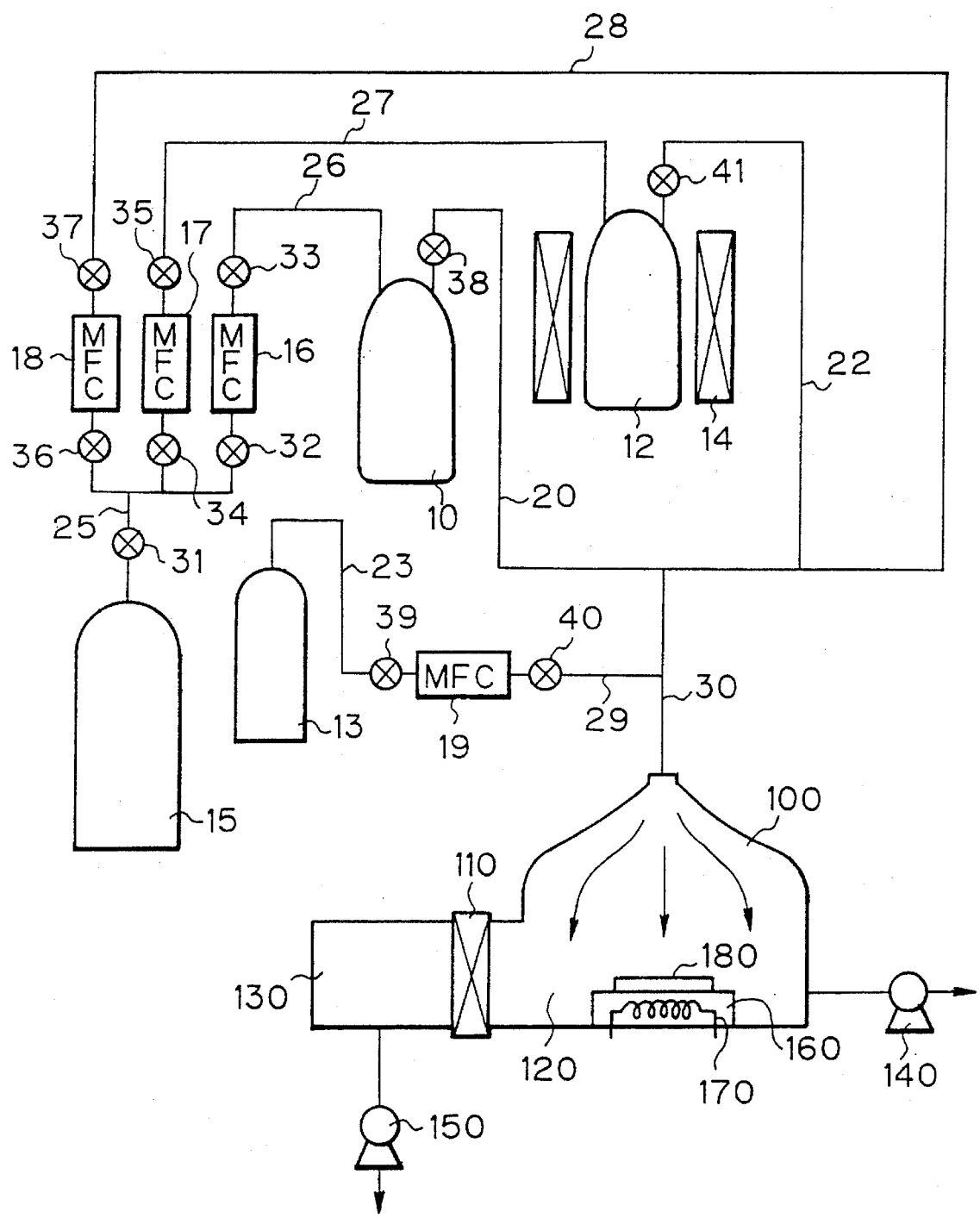
FIG. 1 is a schematic view showing a structure of one embodiment of a CVD apparatus for use in a process for forming an aluminum alloy thin film of the present invention.

FIG. 1 is a schematic view showing a structural embodiment of a CVD apparatus for use in a process for forming an aluminum alloy thin film of the present invention. In the CVD apparatus shown in FIG. 1, dimethylhydriroaluminum as an aluminum (Al) source and bis(hexafluoroacetylacetonato)copper as a copper (Cu) source are respectively charged in bubblers 10 and 12 made of stainless steel, whereas trisilane as a silicon (Si) source in a form of a gas mixture with hydrogen is charged in a cylinder 13 made of stainless steel. Here, since the above bis(hexafluoroacetylacetonato)-copper as a Cu source is solid at room temperature, a heater 14 is provided around the bubbler 12 to heat the material up to from about 40° to 150° C. to make a melt. With this, the material is vaporized to a proper saturated pressure thereof in the bubbler 10. Also it is possible to maintain the temperature from about 15° to 50° C. so as to make dimethylhydriroaluminum as an Al source saturated to a certain proper vapor pressure in the bubbler 10, by, for example, enclosing the buffer 10 by a thermostatic chamber (not shown).

As an Al source, in place of dimethylhydriroaluminum, it is possible to use other trialkylaluminum or dialkylhydriroaluminum that are decomposable at 200° to 400° C., such as, for example, trimethylaluminum, triethylaluminum, tri-isobutylhydriroaluminum, etc. On the other hand, as Cu sources, other chelate compounds that are decomposable at 170° to 350° C., such as, for example, bis(acetylacetonato)copper, bis(tetrafluoroacetylacetonato)copper, bis(ethylenediamine)copper, bis(hexamethylenediamine)copper, bis(glycine)copper, bis(benzoylacetonato)copper, bis(C-methylbenzoylacetonato)copper, bis(salicylaldehyde)copper, bis(5-methylsalicyl-aldehyde)copper, bis(3-fluorosalicylaldehyde)copper, etc. can be used in place of bis(hexafluoroacetylacetonato)copper. As an Si source, a silane compound having 1 to 3 silicon atoms such as monosilane, disilane, other than trisilane can be used.

Hydrogen gas supply lines 26 and 27 are connected to the bubblers 10 and 12 through mass-flow controllers 16 and 17 respectively from a hydrogen gas cylinder 15. Hydrogen gas kept in the hydrogen gas cylinder 15 is arranged so as to be controlled in flow by mass-flow controllers 16 and 17 to be fed into the bubblers 10 and 12 through the supply lines 26 and 27. The Al source and Cu source charged inside the respective bubblers 10 and 12 are conveyed with the hydrogen gas from the respective bubblers 10 and 12 to be introduced to supply lines 20 and 22. The thus introduced Al source gas and Cu source gas from the respective supply lines 20 and 22 are joined together to a dilution gas line 28 individually extended from the hydrogen gas cylinder 15 through a mass-flow controller 18. The dilution gas line 28 joins in a supply line 30 with another supply line 29 extended from the aforementioned Si source supply cylinder 13 through a mass-flow controller 19, and is connected to a reactor 100. As the rector 100 used is a cold wall-type sheet-fed CVD apparatus comprising a main room 120 and a side room 130 partitioned by a valve 110. Needless to say that the reactor 100 is not specified to the cold wall-type sheet-fed CVD apparatus. Exhaust pumps 140 and 150 are connected respectively to the main room 120 and the side room 130 of the reactor 100. The exhaust pump 140, which is connected to the main room 120, is connected at its exhausting side to an unillustrated exhaust gas processing apparatus. Inside the main room 120 of the reactor 100, there is provided a substrate mounting table 160, below which is arranged a resistance heater 170. Lines 20, 22, 23, 25, 26, 27, 28, 29 and 30 have respective valves 31, 32, 33, 34, 35, 36, 37, 38, 39, 40 and 41 disposed in their proper places for controlling the gas flow.

Using the apparatus thus structured, an aluminum alloy thin film is formed on the surface of a semiconductor substrate 180. This process is performed for example as follows.

At first, the exhaust pump 140 is operated to exhaust the main room 120 up to a high vacuum (e.g. 10–9 Torr). A hydrogen gas is fed into the main room 120 from the hydrogen cylinder 15 through the dilution line 28 to make an hydrogen atmosphere having a desired pressure of 0.1 to 760 Torr, preferably, 0.1 to 10 Torr. Next, a semiconductor substrate 180 is fed to the side room 130. Here, the semiconductor 180 has well known circuit elements such as MOSFET etc. formed thereon with a source 182, a drain 184, a gate oxide film 186, a gate electrode 188, a layer insulation film 190 etc. and has a contact hole 192 patterned in a corresponding position to the source 182 or the drain 184. The side room with the substrate 180 is made a vacuum by operating the exhaust pump 150. Then the valve 110 is opened to move the substrate 180 onto the substrate mounting table 160 inside the main room 120.

Figure 3:
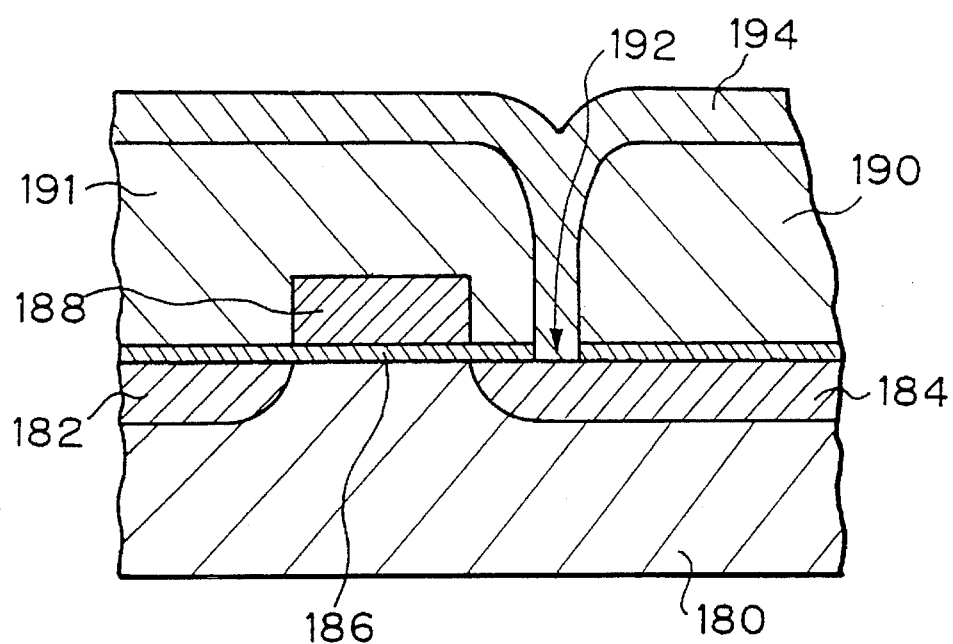
FIG. 3 is a schematic sectional view showing an example of forming an aluminum alloy thin film by applying a method of an embodiment according to the present invention to the material shown in FIG. 2.

Subsequently, valves 31, 32 and 33 on the supply lines 25 and 26 extended from the hydrogen gas cylinder 15 toward the bubbler 10 containing the Al source are opened to send a hydrogen gas into the bubbler 10, whereas valves 31, 34 and 35 on the supply lines 25 and 27 extended from the hydrogen gas cylinder 15 toward the bubbler 12 containing the Cu source are opened to send a hydrogen gas into the bubbler 12. With these operations, the Al source gas and the Cu source gas are lead out from the bubblers 10 and 12 respectively. The valves 39 and 40 on the supply lines 23 and 29 are opened to lead the Si source gas out of the Si source supply cylinder 13. These gases are diluted with the hydrogen gas coming through the dilution gas line 28, and the diluted gas is sent into the reactor 100. The amount of starting gas to be sent into the reactor 100 is defined by the flow of the hydrogen gas that is sent into the bubblers 10 and 12 controlled respectively by the mass-flow controllers 16 and 17; the flow of the Si source gas controlled by the mass controller 19, and the flow of the hydrogen gas as the dilution gas controlled by the mass-flow controller 18. By controlling the flow ratio of each gas, an aluminum alloy thin film 194 having a desired composition can be prepared as shown in FIG. 3 on the surface of the semiconductor substrate 180 stored in the reactor 100. If an Al—Cu alloy is to be prepared, the supply line 29 for Si gas is required to be closed, whereas if an Al—Si alloy is to be formed, the supply line 22 for a Cu source gas needs to be closed.

After the flow ratio of the starting gases fed into the reactor 100 has been stabilized in this manner, the semiconductor substrate 180 is heated by the resistance heater 170 to 250° to 400° C., preferably 300° to 400° C. With this heating, the Al source, Cu source and Si source contained in the starting gas mixture are respectively thermally decomposed above the surface of the semiconductor substrate 180 so as to deposit an aluminum alloy thin film onto the surface of the semiconductor substrate 180. It should be noted that the silane compounds such as trisilane used as the Si source could not usually be decomposed under the aforesaid temperature conditions, but in practice is decomposed by catalytic effects, possibly attributed to the Al and Cu deposited on the surface of the semiconductor substrate 180. The deposition rate of the aluminum alloy thin film is generally approximately 200 to 2000 Å/min, although it depends on the pressure in the reactor, the temperature of the substrate and the flow of the starting gas.

As the aluminum alloy thin film is deposited to a predetermined film thickness, the valves 31, 32, 33, 34 and 35 disposed respectively on the supply lines 25, 26 and 27 extended from the hydrogen gas cylinder 15 toward the bubblers 10 and 12 are closed. Also closed are the valves 39 and 40 on the supply lines 23 and 29 extended from the Si source supply cylinder 13. The resistance heater 170 to heat the substrate 180 is turned off, to thereby stop the reaction. Then the substrate 180 is transferred from the main room 120 to the side room 130. The valve 110 is closed to partition the main room 120 from the side room 130. The side room is opened so that the semiconductor substrate 180 is taken out. At this time, another substrate is loaded to the side room 130 to repeat the same process for forming an aluminum alloy thin film.

In this invention, after the above described process, in which an aluminum alloy thin film 194 has been formed on the semiconductor substrate 180 by the CVD method, the semiconductor substrate 180 is heated in an inert gas such as nitrogen, argon etc. or a hydrogen atmosphere, to 400° to 450° C. for about 30 to 60 minutes using a heat-treating vessel such as, for example, an oven. The heat treatment is effected to eliminate uneven deposition of elements and improve the resistance to electro-migration and stress-migration. The heat-treatment is carried out within the above range temperature, because the aluminum alloy thin film formed could not be sufficiently annealed at a temperature of less than 400° C., whereas if exceeding 450° C., the temperature approaches the eutectic temperature of Al and Si, and this may cause diffusion. In this embodiment, the semiconductor substrate 180 is taken out of the CVD reactor 100 after the process of forming the thin film, and is transferred to the heat-treating vessel to be subjected to the heat-treatment. However, for example, if a heat-treatment room that can be partitioned from the main room 120 of the above CVD reactor 100 by means of a valve is separately provided, it is possible to conduct the procedures from the formation of a thin film to a heat treatment in one closed system.

In the present invention, the flow ratio of Al source gas, Cu source gas and Si source gas in the starting gas mixture is controlled by the processing steps as described above, whereby it is possible to efficiently form an aluminum alloy thin film that has an arbitrary alloy composition in a range of 0 to 5% Cu and 0.1 to 2% Si, and that has a uniform composition distribution in the film layer.

The present invention will be described in further detail based on the following embodiment.

Figure 2:
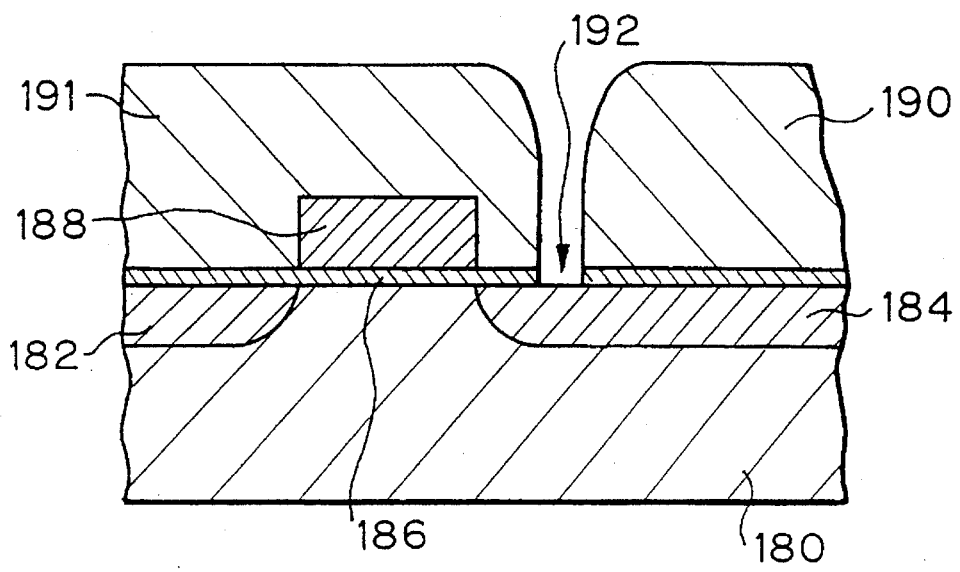
FIG. 2 is a schematic sectional view showing one embodiment of a semiconductor substrate as one of the preferable materials to which the present invention is applied.

In using a CVD apparatus configured as shown in FIG. 1, a silicon wafer 180 was formed thereon with a circuit element as shown in FIG. 2 and patterned with a contact hole 192 (having an aspect ratio of 2.0). Then an aluminum alloy thin film 194 was formed on the silicon wafer 180 as shown in FIG. 3. Here, dimethylhydriroaluminum was used for the Al source, bis(hexafluoroacetylacetonato)copper was used for the Cu source, and a gas mixture of trisilane and hydrogen (in a volume ratio of 1:100) was used for the Si source. A bubbler 12 holding bis(hexafluoroacetylacetonato)copper was heated to 100° C., whereas a bubbler 10 holding dimethylhydriroaluminum as well as a cylinder 13 holding the trisilane/hydrogen gas mixture was maintained at room temperature (2°±1° C.). Hydrogen gas was fed from a hydrogen gas cylinder 15 into the Al source bubbler 10 and the Cu source bubbler 12, so that Al source gas and Cu source gas were respectively produced. The thus generated gases were mixed with the aforementioned Si gas, and diluted by the hydrogen gas to make a starting gas, which is in turn fed into a reactor 100. The total flow of the starting gas was defined to be 500 SCCM, and the flow ratio of Al source gas, Cu source gas and Si source gas varied each time within the total flow range. Each thin film deposition was carried out at a substrate temperature of 300° C., with the reactor being kept at a pressure of 1.2 Torr. In each flow ratio, a thin film was deposited at a deposition rate of approximately 800 Å/min. After the passage of a predetermined period of time, the process was completed, and a silicon wafer 180 was taken out of the reactor 100. The silicon wafer 180 was heat-treated in an oven in a hydrogen atmosphere at 400° C. for 30 minutes. After the heat-treatment, the composition of the thin film formed on the silicon wafer 180 was analyzed, whereby it was confirmed that each aluminum alloy thin film was formed with a different Al-alloy having composition of 0 to 5% Cu and 0.1 to 2% Si, in accordance with each flow ratio. Further it was also assured that the composition of each thin film was uniformly distributed. Moreover, it was also confirmed that the contact hole was completely smoothed by the aluminum alloy thin film formed on each silicon wafer.

We claim:

1. A process for forming an aluminum alloy thin film comprising the steps of:

introducing an organic aluminum compound including at least one of trialkylaluminum and dialkylhydriroaluminum, a cooper chelate compound and a silane compound having one to three silicone atoms, in the form of a gas mixture into a rector holding a substrate heated to 250° to 400° C.;

forming an aluminum alloy thin film containing 0 to 5% copper and 0.1 to 2% silicon on said substrate; and heat-treating the substrate having the aluminum thin film thereon in a hydrogen atmosphere at 400° to 450° C.

2. A process for forming an aluminum alloy thin film according to claim 1, wherein the copper chelate compound is selected from the group consisting of bis(acetylacetonato)copper, bis(tetrafluoroacetonato)copper, bis (ethylenediamine)copper, bis(hexamethylenediamine)copper, bis(glycine)copper, bis(bensoylacetonato)copper, bis(C-methylbenzoylacetonato)copper, bis(salicylaldehyde)copper, bis(5-methylsalicyl-aldehyde)copper, bis(fluorosalicylaldehyde)copper and bis(hexafluoroacetylacetonato)copper.

3. A process of wiring an aluminum alloy thin film for use in a semiconductor integrated circuit comprising:

introducing an organic aluminum compound including at least one of trialkylaluminum and dialkylhydriroaluminum, a copper chelate compound and a silane compound having one to three silicon atoms, in the form of a gas mixture into a reactor holding a substrate heated to 250° to 400° C., and said substrate having a circuit element thereon;

forming an aluminum alloy thin film containing 0 to 5% copper and 0.1 to 2% silicon on said substrate having a circuit element to thereby wire said circuit element; and heat-treating said substrate having the aluminum thin film thereon in a hydrogen atmosphere at 400° to 450° C.

4. The process of wiring an aluminum alloy thin film for use in a semiconductor integrated circuit according to claim 3, further comprising the step of forming a contact hole with the silicon material exposed.

5. The process of wiring an aluminum alloy thin film for use in a semiconductor integrated circuit according to claim 3, wherein the copper chelate compound is selected from the group consisting of bis(acetylacetonato)copper, bis(tetrafluoroacetylacetonato)copper, bis (ethylenediamine)copper, bis(hexamethylenediamine)copper, bis(glycine)copper, bis(bensoylacetonato)copper, bis(C-methylbenzoylacetonato)copper, bis(salicylaldehyde)copper, bis(5-methylsalicyl-aldehyde)copper, bis (fluorosalicylaldehyde)copper and bis(hexafluoroacetylacetonato)copper.

6. The process of forming an aluminum alloy thin film according to claim 1, wherein the organic aluminum compound is selected from the group consisting of dimethylhydriroaluminum, trimethylaluminum, triethylaluminum, and triisobutylhydriroaluminum.

7. The process of wiring an aluminum alloy thin film for use in a semiconductor integrated circuit according to claim 3, wherein the organic aluminum compound is selected from the group consisting of dimethylhydriroaluminum, trimethylaluminum, triethylaluminum, and triisobutylhydriroaluminum.

8. The process of forming an aluminum alloy thin film according to claim 1, wherein the silane compound is trisilane.

9. The process of wiring an aluminum alloy thin film for use in a semiconductor integrated circuit according to claim 3, wherein the silane compound is trisilane.

10. The process of forming an aluminum alloy thin film according to claim 1, wherein the substrate having the aluminum thin film thereon is heat treated for about 30 to about 60 minutes.

11. The process of wiring an aluminum alloy thin film for use in a semiconductor integrated circuit according to claim 3, wherein the substrate having the aluminum thin film thereon is heat treated for about 30 to about 60 minutes.

12. The process of wiring an aluminum alloy thin film for use in a semiconductor integrated circuit according to claim 4, wherein the contact hole has an aspect ratio of about b 2.

* * * * *